United States Patent
Pu et al.

(10) Patent No.: US 11,239,852 B2
(45) Date of Patent: Feb. 1, 2022

(54) ERROR COMPENSATION CORRECTION SYSTEM AND METHOD FOR ANALOG-TO-DIGITAL CONVERTER WITH TIME INTERLEAVING STRUCTURE

(71) Applicant: NO.24 RESEARCH INSTITUTE OF CHINA ELECTRONICS TECHNOLOGY GROUP CORPORATION, Chongqing (CN)

(72) Inventors: Jie Pu, Chongqing (CN); Gangyi Hu, Chongqing (CN); Jian'an Wang, Chongqing (CN); Guangbing Chen, Chongqing (CN); Liang Li, Chongqing (CN); Ting Li, Chongqing (CN); Daiguo Xu, Chongqing (CN); Xingfa Huang, Chongqing (CN); Xi Chen, Chongqing (CN); Tiehu Li, Chongqing (CN); Youhua Wang, Chongqing (CN)

(73) Assignee: NO.24 RESEARCH INSTITUTE OF CHINA ELECTRONICS TECHNOLOGY GROUP CORPORATION, Chongqing (CN)

( * ) Notice: Subject to any disclaimer, the term of this patent is extended or adjusted under 35 U.S.C. 154(b) by 0 days.

(21) Appl. No.: 17/257,011

(22) PCT Filed: Jul. 25, 2018

(86) PCT No.: PCT/CN2018/096975
§ 371 (c)(1),
(2) Date: Dec. 30, 2020

(87) PCT Pub. No.: WO2020/014998
PCT Pub. Date: Jan. 23, 2020

(65) Prior Publication Data
US 2021/0135678 A1 May 6, 2021

(30) Foreign Application Priority Data

Jul. 20, 2018 (CN) .......................... 201810803457.4

(51) Int. Cl.
*H03M 1/06* (2006.01)
*H03M 1/10* (2006.01)
(Continued)

(52) U.S. Cl.
CPC ....... *H03M 1/0609* (2013.01); *H03M 1/0624* (2013.01); *H03M 1/0673* (2013.01);
(Continued)

(58) Field of Classification Search
CPC ............ H03M 1/0609; H03M 1/0673; H03M 1/0624; H03M 1/0836; H03M 1/1028; H03M 1/1215
(Continued)

(56) References Cited

U.S. PATENT DOCUMENTS 8,310,387 B2 * 11/2012 Harris ................. H03M 1/0836
341/155
9,294,112 B1 * 3/2016 Devarajan ........... H03M 1/0836

FOREIGN PATENT DOCUMENTS

CN  101718562 A  6/2010
CN  201830239 U  5/2011
(Continued)

*Primary Examiner* — Khai M Nguyen

(57) ABSTRACT

The present disclosure provides an error compensation correction system and method for an analog-to-digital converter with a time interleaving structure, the system includes an analog-to-digital converter with a time interleaving structure, a master clock module, a packet clock module, an error correction module, an adaptive processing module and an overall MUX circuit. Through the error compensation correction system and method for the analog-to-digital converter with a time interleaving structure according to the present disclosure, lower correction hardware implementa-
(Continued)

tion complexity and higher stability are ensured. The system and method according to the present disclosure are particularly suitable for interchannel mismatch error correction of dense channel time interleaving ADC, and the performance of the time interleaving ADC is improved.

13 Claims, 3 Drawing Sheets

(51) Int. Cl.
*H03M 1/12* (2006.01)
*H03M 1/08* (2006.01)

(52) U.S. Cl.
CPC ....... *H03M 1/0836* (2013.01); *H03M 1/1028* (2013.01); *H03M 1/1215* (2013.01)

(58) Field of Classification Search
USPC .................................................. 341/118, 155
See application file for complete search history.

(56) References Cited

FOREIGN PATENT DOCUMENTS

| | | |
|---|---|---|
| CN | 104038226 A | 9/2014 |
| CN | 104993827 A | 10/2015 |
| CN | 108183710 A | 6/2018 |

\* cited by examiner

ERROR COMPENSATION CORRECTION SYSTEM AND METHOD FOR ANALOG-TO-DIGITAL CONVERTER WITH TIME INTERLEAVING STRUCTURE

CROSS REFERENCES TO RELATED APPLICATIONS

This is a Sect. 371 National Stage application of a PCT International Application No. PCT/CN2018/096975, filed on Jul. 25, 2018, which claims the benefits of priority to Chinese Patent Application No. 2018108034574, entitled "Error Compensation Correction System and Method for Analog-To-Digital Converter with Time Interleaving Structure", filed with CNIPA on Jul. 20, 2018, the contents of which are incorporated herein by reference in its entirety.

TECHNICAL FIELD

The present disclosure relates to the field of electronic, and in particular, to an error compensation correction system and method for an analog-to-digital converter with a time interleaving structure.

BACKGROUND

In recent years, limited by the performance of analog circuits, the sampling rate of single-structure analog-to-digital converter (ADC) is approaching its limit. In applications requiring extremely high sampling rates, time-interleaved analog-to-digital converters (TI ADCs) have received increasing attention. The common method is that in a TI ADC using L channel sub ADCs, each channel sub ADC operates at Fs/L, where Fs is the sampling rate of the TI ADC. A multiplexer (MUX) is used to combine the outputs from each channel sub-ADC at Fs, to produce a sample rate converter operating at Fs. However, due to factors such as fabrication errors, temperature, voltage, and environmental disturbances, there are bias, gain, and clock phase error between channels, which vary with the working environment. The error would result in spurious error component at k Fs/L±fin (fin is the input signal frequency), greatly reducing the performance of the time-interleaving ADC.

In order to solve the above technical problems, a correction technology based on a reference channel has appeared. The correction technology is mainly performed by using one channel as a reference channel, estimates and corrects the error of other channels by calculating the difference between the channels and the reference channel. However, this method has obvious disadvantages: with the increase of the number of TI ADC integrated channels, more and more hardware resources are required to correct the error between channels, leading to higher power consumption; the algorithm convergence stability would decrease due to the mutual influence of the estimation results between channels. At the same time, the increase in the number of channels means that more sample points would be used for the estimation and update of a single parameter to reduce the estimation error, thus reducing the convergence speed of correction. With the continuous development of TI ADCs, the number of integrated channels is increasing, and the sampling rate is rising. Therefore, it is more difficult to realize accurate correction at a low circuit complexity. When dealing with the mismatch errors between TI ADCs in dense channel integration, the traditional error estimation and correction technology has high implementation complexity and heavy computation, therefore it is difficult to achieve good results in TI ADC having a large number of channels.

SUMMARY

The present disclosure provides an error compensation correction system and method for an analog-to-digital converter with a time interleaving structure, to solve the above-mentioned problems.

The present disclosure provides an error compensation correction system for an analog-to-digital converter with a time interleaving structure, including an analog-to-digital converter with a time interleaving structure, and further including a master clock module, a packet clock module, an error correction module, an adaptive processing module and an overall MUX circuit;

the analog-to-digital converter with a time interleaving structure includes a plurality of sub-ADCs with the same structure, and the sub-ADCs are packeted. The number of packet clock modules is the same as the number of sub-ADCs packets, and each packet of sub-ADCs is respectively connected to the corresponding packet clock module.

The master clock module generates a packet master clock; each packet clock module is respectively connected to the master clock module, and the operation clock of the sub-ADC in the packet and the packet channel clock selection signal are obtained through the packet clock module connected with the packet;

the error correction module corrects the analog-to-digital converter according to a correction parameter;

the adaptive processing module estimates the bias, gain, and clock phase error between the packets according to the data corrected by the error correction module, and updates the correction parameters;

the overall MUX circuit synthesizes the corrected data of each packet into the system output data according to the phase order of corresponding packet master clock. In this way, the present disclosure solves the problems of high correction hardware implementation complexity and low correction stability of the traditional technology under dense channel integration.

Further, the system includes a plurality of packet data processing modules with the same structure. Each packet processing module is connected to the packet clock module in the same packet, to pre-correct the output data of the sub-ADCs in the packet according to a preset threshold. At the same time, under the control of the packet channel clock selection signal of the corresponding packet, the output data after pre-correction is synthesized into the output data of the packet according to the phase order of the sub-ADC operation clock in the packet.

Further, the packet clock module includes:

a packet internal clock unit, to generate N packet internal clocks with uniform phase and frequency of fs through the input packet master clock;

a numerical control adjustable analog delay line unit, to fine-tune the phase of the N packet internal clocks according to the preset threshold;

a random signal generation unit, to generate a packet channel clock selection signal;

a clock matrix MUX unit, to obtain an operation clock of the sub-ADC in the packet according to packet channel clock selection signal and the packet internal clock.

Further, the analog-to-digital converter with a time interleaving structure includes M×(N+ΔN) sub-ADCs, M is the number of packets, the sampling frequency of each sub- ADC is fs, and the sampling frequency of the analog-to-digital converter with a time interleaving structure is M×N× fs;

The clock matrix MUX unit randomly allocates the N packet internal clocks and ΔN 0 level signals to the sub-ADCs inside the packet as the operation clocks according to the packet channel clock selection signal.

Correspondingly, the present disclosure further provides an error compensation correction method for an analog-to-digital converter with a time interleaving structure, including:

packeting a plurality of sub-ADCs with the same structure in the analog-to-digital converter with a time interleaving structure;

connecting each sub-ADC packet with a corresponding packet clock module, the number of packet clock modules is the same as the number of sub-ADCs packets, and each packet clock module is respectively connected to a master clock module;

obtaining the operation clock of the sub-ADC in the packet and the packet channel clock selection signal through the packet clock module connected with the packet;

correcting the analog-to-digital converter according to a correction parameter;

estimating the bias, gain and clock phase error between the packets according to the corrected data, and updating the correction parameter;

synthesizing the corrected data output by each packet into the system output data according to the phase order of corresponding packet master clock, and completing the error compensation correction of the analog-to-digital converter with a time interleaving structure.

Further, pre-correcting the output data of the sub-ADCs in the packet according to a preset threshold; synthesizing, under the control of the packet channel clock selection signal of the corresponding packet, the pre-corrected output data into the output data of the packet according to the phase order of the sub-ADC operation clock in the packet; and pre-correcting the phase of the N packet internal clocks according to the preset threshold.

Further, the analog-to-digital converter with a time interleaving structure includes M×(N+ΔN) sub-ADCs, M is the number of packets, the sampling frequency of each sub-ADC is fs, and the sampling frequency of the analog-to-digital converter with a time interleaving structure is M×N× fs;

the N packet internal clocks and ΔN 0 level signals are randomly allocated to the sub-ADCs inside the packet as the operation clocks according to the packet channel clock selection signal, such that the (N+ΔN) sub-ADCs in the packet operate alternately at random.

Further, the correction parameters include a bias correction parameter, a gain correction parameter, and a clock phase correction parameter. The bias error and gain error corrections between packets are corrected through the bias correction parameter and the gain correction parameter, and the packet correction data is output. Then, the clock phase error correction is corrected according to the clock phase correction parameter.

Further, the bias and gain error corrections between the packets includes: conducting an add operation at the k-th bias correction parameter $o_k$ and the k-th packet output data, and then conducting an add operation and a multiply operation at the k-th gain correction parameter $g_k$ and the k-th packet output data, to obtain the k-th packet correction data $x_k(n)$.

Further, the clock phase error correction includes: decoding the k-th clock phase correction parameter $\tau_k$ to generate a control signal, controlling a numerical control adjustable analog delay line unit inserted in the path of a k-th packet master clock to realize the clock phase error correction of the k-th packet master clock.

Further, the k-th bias correction parameter $o_k$ is estimated through the optimal value of the bias error loss function. The bias error loss function is as follows:

$$P\{o_k\} = \arg \min_{o_k} \left\{ \left[ \frac{1}{N_p} \cdot \sum_{n=n_0}^{n_0+N_p-1} x_k(n) \right]^2 \right\}$$

or $$P\{o_k\} = \arg \min_{o_k} \left\{ \left[ \frac{1}{N_p} \cdot \sum_{n=n_0}^{n_0+N_p-1} x_k(n) - \frac{1}{N_p} \cdot \sum_{n=n_0}^{n_0+N_p-1} x_m(n) \right]^2 \right\},$$

make $o_m = 0, k \neq m$ or $$P\{o_k\} = \arg \min_{o_k} \left\{ \left[ \frac{1}{N_p} \cdot \sum_{n=n_0}^{n_0+N_p-1} x_k(n) - \frac{1}{N_p} \cdot \frac{1}{M} \cdot \sum_{i=1}^{M} + \sum_{n=n_0}^{n_0+N_p-1} x_i(n) \right]^2 \right\}$$

$x_k(n)$ is the k-th packet correction data.

Further, the k-th gain error parameter $g_k$ is estimated through the optimal value of the gain error loss function. The gain error loss function is as follows:

$$P\{g_k\} = \arg \min_{g_k} \left\{ \left[ \frac{1}{N_p} \cdot \sum_{n=n_0}^{n_0+N_p-1} |x_k(n)| - \frac{1}{N_p} \cdot \frac{1}{M} \cdot \sum_{j=1}^{M} \sum_{n=n_0}^{n_0+N_p-1} |x_j(n)| \right]^2 \right\}$$

or $$P\{g_k\} = \arg \min_{g_k} \left\{ \left[ \frac{1}{N_p} \cdot \sum_{n=n_0}^{n_0+N_p-1} |x_k(n)| - \frac{1}{N_p} \cdot \sum_{n=n_0}^{n_0+N_p-1} |x_m(n)| \right]^2 \right\},$$

make $g_m = 0, k \neq m$ $x_k(n)$ is the k-th packet correction data.

Further, the k-th clock phase error parameter $\tau_k$ is estimated through the optimal value of the clock phase error loss function. The clock phase error loss function is as follows:

$$E\{\tau_k\} = \arg \min_{\tau_k} \left\{ \left[ \frac{1}{N_p} \cdot \sum_{n=n_0}^{n_0+N_p-1} |x_k(n) - x_{k+1}(n)| - \frac{1}{N_p} \cdot \frac{1}{M} \sum_{n=n_0}^{n_0+N_p-1} \left( \sum_{i=1}^{M-1} |x_i(n) - x_{i+1}(n)| + |x_M(n) - x_1(n+1)| \right) \right]^2 \right\},$$

$k = 1, 2, 3, \ldots, M-1$

-continued $$E\{\tau_k\} = \arg\min_{\tau_k}\left\{\left[\frac{1}{N_p} \cdot \sum_{n=n_0}^{n_0+N_p-1} |x_k(n) - x_1(n+1)| - \frac{1}{N_p} \cdot \frac{1}{M} \sum_{n=n_0}^{n_0+N_p-1}\left(\sum_{i=1}^{M-1} |x_i(n) - x_{i+1}(n)| + |x_M(n) - x_1(n+1)|\right)\right]^2\right\},$$

$$k = M$$

$x_k(n)$ is the k-th packet correction data.

Beneficial effects of the present disclosure: the error compensation correction system and method for the analog-to-digital converter with a time interleaving structure according to the present disclosure has lower correction hardware implementation complexity and higher stability. The effects of bias, gain and clock phase errors within the packet that remain after pre-correction in the foreground of sub-ADCs and that fluctuate with changes in the working environment between sub-ADCs are eliminated by randomization. At the same time, the effects of bias, gain and clock phase errors between the packets are eliminated by real-time estimation. The system and method according to the present disclosure are particularly suitable for interchannel mismatch error correction of dense channel time interleaving ADC, and the performance of the time interleaving ADC is improved.

DETAILED DESCRIPTION OF THE PREFERRED EMBODIMENTS

The embodiments of the present disclosure will be described below through exemplary embodiments. Those skilled in the art can easily understand other advantages and effects of the present disclosure according to contents disclosed by the specification. The present disclosure can also be implemented or applied through other different exemplary embodiments. Various modifications or changes can also be made to all details in the specification based on different points of view and applications without departing from the spirit of the present disclosure. It needs to be stated that the following embodiments and the features in the embodiments can be combined with one another under the situation of no conflict.

It needs to be stated that the drawings provided in the following embodiments are just used for schematically describing the basic concept of the present disclosure, thus only illustrating components only related to the present disclosure and are not drawn according to the numbers, shapes and sizes of components during actual implementation, the configuration, number and scale of each component during actual implementation thereof may be freely changed, and the component layout configuration thereof may be more complex.

Figure 1:
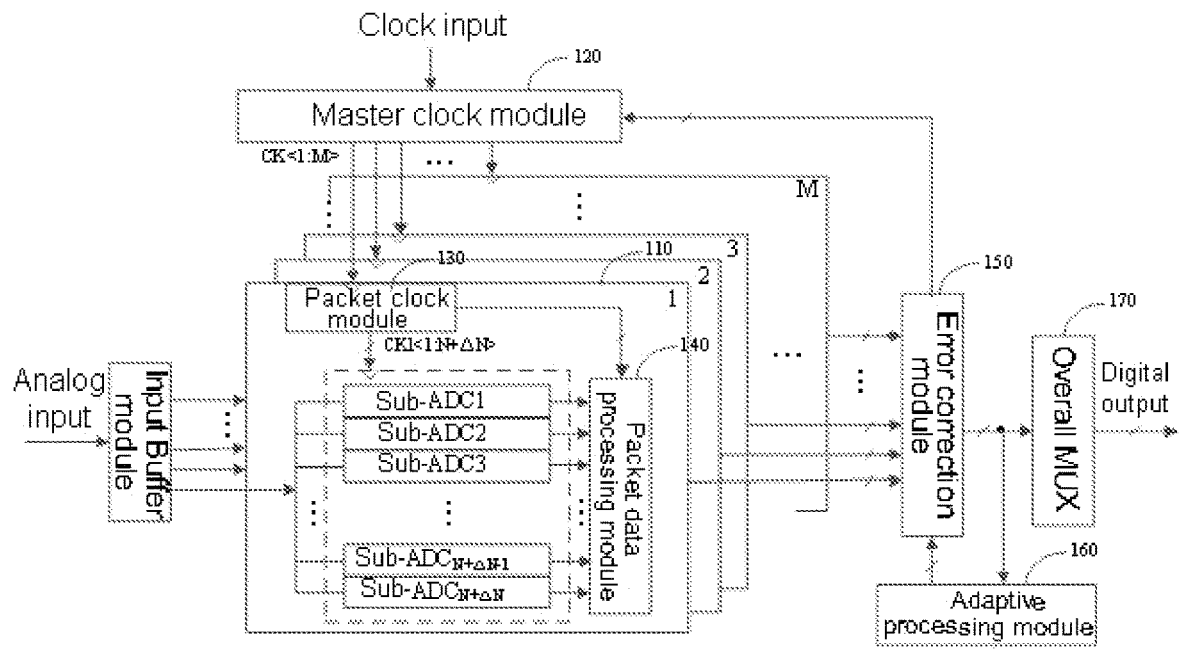
FIG. 1 is a schematic diagram of an error compensation correction system for the analog-to-digital converter with a time interleaving structure according to an embodiment of the present disclosure.

As shown in FIG. 1, the error compensation correction system for the analog-to-digital converter with a time interleaving structure in this embodiment includes an analog-to-digital converter with a time interleaving structure, a master clock module 120, a packet clock module 130, an error correction module 150, an adaptive processing module 160 and an overall multiplexer (MUX) circuit 170. The analog-to-digital converter with a time interleaving structure includes a plurality of sub-ADCs with the same structure, and the sub-ADCs are packeted. The number of packet clock modules is the same as the number of sub-ADCs packets, and each packet of sub-ADCs is respectively connected to the corresponding packet clock module. The master clock module 120 generates a packet master clock. In this embodiment, the master clock module 120 generates M packet master clock CLK<1:M> with uniform phase and frequency of N×fs. A numerical control analog delay line module is inserted into the path of each packet master clock. Each packet clock module is respectively connected to the master clock module, and the operation clock of the sub-ADC in the packet and the packet channel clock selection signal are obtained through the packet clock module connected with the packet. The error correction module 150 corrects the analog-to-digital converter according to a correction parameter, so as to eliminate the bias, gain and clock phase errors between the packets. The adaptive processing module 160 estimates the bias, gain, and clock phase error between the packets according to the data corrected by the error correction module, and updates the correction parameters. The overall MUX circuit 170 synthesizes the correction data of each packet into the system output data according to the phase order of corresponding packet master clock.

In this embodiment, the analog-to-digital converter with a time interleaving structure includes M×(N+ΔN) sub-ADCs. All the sub-ADCs are divided into M packets 110, and each packet 110 includes (N+ΔN) sub-ADCs. The sampling frequency of each sub-ADC is fs, and the sampling frequency of the analog-to-digital converter with a time interleaving structure is M×N×fs. For each packet 110, a corresponding packet clock module 130 and a packet data processing module 140 are provided. The packet clock module 130 generates the operation clock of the (N+ΔN)sub-ADCs within the packet by using the corresponding input packet master clock, and generates a packet channel clock selection signal of the sub-ADCs within the packet. The packet data processing module 140 conducts an add operation and a multiply operation at the output data of the (N+ΔN)sub-ADCs in the packet according to the preset threshold (i.e. the externally set preset values of bias error correction and gain error correction), to realize the foreground pre-correction of the bias and gain errors of the sub-ADCs inside the packet. Under the control of the corresponding packet channel clock selection signal, the pre-corrected output data is synthesized into the packet output data with a sampling frequency of N×fs according to the phase order of the sub-ADC operation clocks in the packet. The preset values of bias error correction and gain error correction can be measured and obtained by the currently mature foreground bias and gain error estimation methods, and can be input through an external SPI interface.

Figure 2:
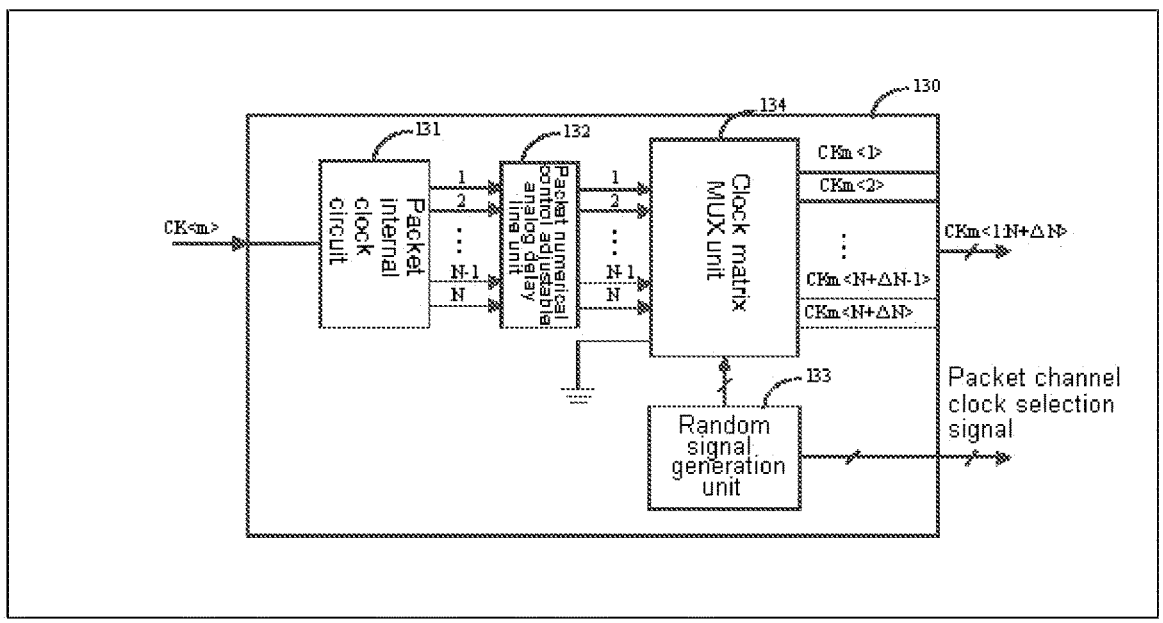
FIG. 2 is a schematic diagram of the circuit structure of a packet clock module in the error compensation correction system for the analog-to-digital converter with a time interleaving structure according to an embodiment of the present disclosure.

As shown in FIG. 2, the packet clock module 130 in this embodiment includes a packet internal clock circuit 131, a packet numerical control adjustable analog delay line unit 132, a random signal generation unit 133, and a clock matrix MUX unit 134. The packet internal clock unit 131 generates N packet internal clocks with uniform phase and frequency of fs by using the corresponding input packet master clock. The packet numerical control adjustable analog delay line unit 132 fine-tunes the phase of the N packet internal clocks according to the preset threshold (i.e. the preset correction value for clock phase error set externally), to realize the foreground adjustment of the clock phase error between the sub-ADCs in the packet. The preset value of clock phase error correction can be measured and obtained by the currently mature foreground clock phase error estimation methods, and can be input through an external SPI interface. The random signal generation unit 133 generates a randomly varying packet channel clock selection signal.

The clock matrix MUX unit 134 in this embodiment may randomly allocate, under the control of the packet channel clock selection signal, the N packet internal clocks and ΔN 0 level signals to the N+ΔN sub-ADCs inside the packet as the operation clocks. At any time, only N sub-ADCs are connected to the packet internal clocks, and ΔN sub-ADCs are in a non-operating state because the input terminals of the operation clocks are connected to 0 level, so that (N+ΔN) sub-ADCs in the packet operate alternately at random. The input terminals of the clock matrix MUX unit 134 are connected to the N packet internal clocks and 0 level signals, and the output terminals of the clock matrix MUX unit 134 are connected to input terminals of the operation clocks of the N+ΔN sub-ADCs in the packet. When the packet internal clock is at a high level (i.e. the sub-ADCs are in a sampling operating state), the clock matrix MUX unit 134 does not perform the control operation of switching the access state of the corresponding packet internal clock. When the packet internal clock is at a low level, the clock matrix MUX unit 134 switches the access state of the corresponding packet internal clock under the control of the packet channel clock selection signal, keeping the sub-ADC currently accessed by the packet internal clock unchanged, or switching the packet internal clock to the sub-ADC that is currently in the non-operating state and switching the input terminal of the operation clock of the sub-ADC originally connected to the packet internal clock to the 0 level. In this way, the sub-ADC channels operating at the current clock phase are randomly selected, to realize the randomization of the operation state of the sub-ADCs in the packet. The effects of bias, gain and clock phase errors within the packet that remain after pre-correction in the foreground of sub-ADCs and that fluctuate with changes in the working environment between sub-ADCs are eliminated and whitened to a noise floor.

In this embodiment, the error correction module 150 performs add and multiply operations using M bias correction parameters, M gain correction parameters and the 1-st to M-th packet output data to realize the corrections of the bias and gain errors between the packets, and outputs the 1-st to M-th packet corrected data. The error correction module 159 controls the numerical control analog delay line circuits in the paths of M packet master clocks, respectively, after decoding the M clock phase correction parameters, so as to realize clock phase error correction.

Correspondingly, this Embodiment further provides an error compensation correction method for an analog-to-digital converter with a time interleaving structure, including:

packeting a plurality of sub-ADCs with the same structure in the analog-to-digital converter with a time interleaving structure;

connecting each sub-ADC packet with a corresponding packet clock module, the number of packet clock modules is the same as the number of sub-ADCs packets, and each packet clock module is respectively connected to a master clock module;

obtaining the operation clock of the sub-ADC in the packet and the packet channel clock selection signal through the packet clock module connected with the packet;

correcting the analog-to-digital converter according to a correction parameter;

estimating the bias, gain and clock phase errors between the packets according to the corrected data, and updating the correction parameter;

synthesizing the corrected data output by each packet into the system output data according to the phase order of corresponding packet master clock, and completing the error compensation correction of the analog-to-digital converter with a time interleaving structure.

In this embodiment, the method further includes: pre-correcting the output data of the sub-ADCs in the packet according to the preset values of bias correction and gain correction of the sub-ADCs; synthesizing, under the control of the packet channel clock selection signal of the corresponding packet, the pre-corrected output data into the output data of the packet according to the phase order of the sub-ADC operation clock in the packet; pre-correcting the phase of the N packet internal clocks according to the preset value of clock phase correction. The analog-to-digital converter with a time interleaving structure includes M×(N+ΔN) sub-ADCs, M is the number of packets, the sampling frequency of each sub-ADC is fs, and the sampling frequency of the analog-to-digital converter with a time interleaving structure is M×N×fs. The N packet internal clocks and ΔN 0 level signals are randomly allocated to the sub-ADCs inside the packet as the operation clocks according to the packet channel clock selection signal, such that the (N+ΔN) sub-ADCs in the packet operate alternately at random. The effects of bias, gain and clock phase errors within the packet that remain after pre-correction in the foreground of sub-ADCs and that fluctuate with changes in the working environment between sub-ADCs are eliminated and whitened to a noise floor. In this embodiment, the correction parameters include a bias correction parameter, a gain correction parameter, and a clock phase correction parameter. The bias and gain error between packets are corrected through the bias correction parameter and the gain correction parameter, and the packet correction data is output. Then, the clock phase error is corrected according to the clock phase correction parameter.

In this embodiment, the corrections of the bias and gain between the packets can be implemented according to the following formulas:

$$y_{k\_dg}(n)=y_k(n) \times g_k$$

$$x_k(n)=y_k(n)+y_{k\_dg}(n)+o_k$$

$y_k(n)$ is the k-th packet output data, $o_k$ and $g_k$ are the k-th bias correction parameter and the k-th gain correction parameter respectively corresponding to the k-th packet output data, $x_k(n)$ is the k-th packet correction data.

The k-th clock correction parameter $\tau_k$ is decoded to generate a control signal, which controls a numerical control analog delay line circuit inserted in the path of the k-th packet master clock, so as to eliminate the clock phase error between the k-th packet and other packets as a whole.

Preferably, in this embodiment, for the input 1-st to M-th packet correction data, an average statistical method and a cyclic correlation method may be used to estimate the bias, gain, and clock phase errors between the packets, and to update the M bias correction parameter, M gain correction parameters, and M clock phase correction parameters. Assuming that the input signal meets the characteristics of a generalized stationary random signal and the mean value is stable (in fact, the sampling signal of the A/D converter basically meets or instantaneously meets such assumption), then the bias error between the packets is reflected as the statistical mean difference of the packet data. The bias error loss function is:

$$P\{o_k\} = \arg \min_{o_k}\{[E\{x_k(n)\}]^2\},$$

at this time, it is assumed that the input signal has no direct current component, and eliminating the direct current component of each packet correction data eliminates the bias error between the packets;
or $$P\{o_k\} = \arg \min_{o_k}\{[E\{x_k(n) - x_m(n)\}]^2\},$$

at this time, taking the m-th packet correction data as a reference, setting $o_m=0$, $k \neq m$, eliminating the direct current bias of other packet correction data relative to the m-th packet correction data;
or $$P\{o_k\} = \arg \min_{o_k}\left\{\left[E\left\{x_k(n) - \frac{1}{N}\sum_{i=1}^{N}x_i(n)\right\}\right]^2\right\},$$

at this time, taking the mean value of the 1-st to M-th packet correction data as a reference;

$o_k$ is the k-th bias correction parameter, and $x_k(n)$ is the k-th packet correction data.

In this embodiment, the bias error loss function is calculated by average of the sample points $N_p$ in a certain length instead of expectation. The optimal value of the bias error loss function can be solved according to the following formula, and the k-th bias error parameter can be estimated according to the following formulas:

$$P\{o_k\} = \arg \min_{o_k}\left\{\left[\frac{1}{N_p} \cdot \sum_{n=n_0}^{n_0+N_p-1} x_k(n)\right]^2\right\}$$

or $$P\{o_k\} = \arg \min_{o_k}\left\{\left[\frac{1}{N_p} \cdot \sum_{n=n_0}^{n_0+N_p-1} x_k(n) - \frac{1}{N_p} \cdot \sum_{n=n_0}^{n_0+N_p-1} x_m(n)\right]^2\right\},$$

$o_m = 0, k \neq m$; or $$P\{o_k\} = \arg \min_{o_k}\left\{\left[\frac{1}{N_p} \cdot \sum_{n=n_0}^{n_0+N_p-1} x_k(n) - \frac{1}{N_p} \cdot \frac{1}{N} \cdot \sum_{i=1}^{N}\sum_{n=n_0}^{n_0+N_p-1} x_i(n)\right]^2\right\}$$

Assuming that the input signal meets the characteristics of a generalized stationary random signal (in fact, the sampling signal of the A/D converter basically meets or instantaneously meets such assumption), defining a cyclic correlation function $R(n, n')=E\{x(n) \times (n')\}$, for the ADC with time interleaving of M channels, $R(n, n')=R(n+M, n'+M)$; when there is no mismatch error between the channels, $R(n,n')=R(n+k,n'+k)$;

defining the error loss function as $P(\tau, g)=\arg \min\{[R(u, u+a)-R(v, v+a)]^2\}$. If there is no gain or clock phase mismatch error between adjacent channels, then P=0.

Setting a=0, the gain error loss function is obtained:

$$P\{g\}=\arg \min\{[E\{x_i(n)^2\}-E\{x_j(n)^2\}]^2\}$$

Since $x^2$ is proportional to $|x|$ and has the same extreme point, the above formula is simplified to: $P\{g\}=\arg \min\{[E\{|x_i(n)|\}-E\{|x_j(n)|\}]^2\}$ Setting a=1, the clock phase error loss function is obtained:

$$P\{\tau\}=\arg \min\{[E\{x_i(n)x_{i+1}(n)\}-E\{x_j(n)x_{j+1}(n)\}]^2\}$$

When the gain error is eliminated, $E\{x_i^2\}=E\{x_j^2\}$, at this time, $E\{x_i \cdot x_{i+1}-x_j \cdot x_{j+1}\}=0.5 \cdot E\{(x_i+x_{i+1})^2-(x_j+x_{j+1})^2\}$, or $E\{x_i \cdot x_{i+1}-x_j \cdot x_{j+1}\}=-0.5 \cdot E\{(x_i-x_{i+1})^2-(x_j+x_{j+1})^2\}$, $x^2$ is proportional to $|x|$ and has the same extreme point. Therefore, without loss of generality, the implementation mode of the clock phase error loss function is simplified as:

$$P\{96\}=\arg \min\{[E\{|x_i(n)+x_{i+1}(n)|\}-E\{|x_j(n)+x_{j+1}(n)|\}]^2\}$$

g and $\tau$ are the gain correction parameter set and the clock phase correction parameter set corresponding to the data of the sub-ADCs of the 1-st to M-th packets, respectively.

In actual implementation, sample points $N_p$ in a certain length are averaged to replace the expectation, to calculate gain and clock phase error loss functions;

In this embodiment, the following formulas can be used to simplify the solution of the optimal values of the gain error loss function and the clock phase error loss function, and to estimate the k-th gain error parameter and the k-th clock phase error loss function.

The gain error loss function is:

$$P\{g_k\} = \arg \min_{g_k}\left\{\left[\frac{1}{N_p} \cdot \sum_{n=n_0}^{n_0+N_p-1} |x_k(n)| - \frac{1}{N_p} \cdot \frac{1}{M}\sum_{j=1}^{M}\sum_{n=n_0}^{n_0+N_p-1} |x_j(n)|\right]^2\right\}$$

or $$P\{g_k\} = \arg\min_{g_k}\left\{\left[\frac{1}{N_p}\cdot\sum_{n=n_0}^{n_0+N_p-1}|x_k(n)| - \frac{1}{N_p}\cdot\sum_{n=n_0}^{n_0+N_p-1}|x_m(n)|\right]^2\right\},$$

$$g_m = 0, k \neq m;$$

$g_k$ is the k-th gain correction parameter, $\tau_k$ is the k-th clock phase correction parameter corresponding to the k-th packet output data, $x_k(n)$ is the k-th packet correction data.

The clock phase error loss function is:

$$P\{\tau_k\} = \arg\min_{t_k}\left\{\left[\frac{1}{N_p}\cdot\sum_{n=n_0}^{n_0+N_p-1}|x_k(n)-x_{k+1}(n)| - \frac{1}{N_p}\cdot\frac{1}{M}\sum_{n=n_0}^{n_0+N_p-1}\left(\sum_{i=1}^{M-1}|x_i(n)-x_{i+1}(n)|+|x_M(n)-x_1(n+1)|\right)\right]^2\right\},$$

$$k = 1, 2, 3, \ldots, M-1$$

$$P\{\tau_k\} = \arg\min_{t_k}\left\{\left[\frac{1}{N_p}\cdot\sum_{n=n_0}^{n_0+N_p-1}|x_k(n)-x_1(n+1)| - \frac{1}{N_p}\cdot\frac{1}{M}\sum_{n=n_0}^{n_0+N_p-1}\left(\sum_{i=1}^{M-1}|x_i(n)-x_{i+1}(n)|+|x_M(n)-x_1(n+1)|\right)\right]^2\right\},$$

$$k = M$$

Preferably, this embodiment uses a Least Mean Square (LMS) algorithm to update the k-th bias, gain, and clock phase error correction parameters by calculating the optimal values of the bias, gain, and clock phase error loss functions, to achieve iterative update convergence of the correction parameters, as shown in the following Formula.

The expression of updating the bias error correction parameter is:

$$o_k^{(i+1)} = o_k^{(i)} - \mu_o \cdot P_o(k) \text{ or } o_k^{(i+1)} = o_k^{(i)} - \mu_o \cdot \text{sign}(P_o(k))$$

$P_o(k)$ is proportional to $$\frac{\partial P(o_k)}{\partial o_k}, P_o(k) = \frac{1}{N_p}\cdot\sum_{n=n_0}^{n_0+N_p-1}x_k(n) \text{ or }$$

$$P_o(k) = \frac{1}{N_p}\cdot\sum_{n=n_0}^{n_0+N_p-1}x_k(n) - \frac{1}{N_p}\cdot\sum_{n=n_0}^{n_0+N_p-1}x_m(n), k \neq m \text{ or}$$

$$P_o(k) = \frac{1}{N_p}\cdot\sum_{n=n_0}^{n_0+N_p-1}x_k(n) - \frac{1}{N_p}\cdot\frac{1}{M}\sum_{i=1}^{M}\sum_{n=n_0}^{n_0+N_p-1}x_i(n)$$

The expression of updating the gain error correction parameter is:

$$g_k^{(i+1)} = g_k^{(i)} - \mu_g \cdot P_g(k) \text{ or } g_k^{(i+1)} = g_k^{(i)} - \mu_g \cdot \text{sign}(P_g(k))$$

$P_g(k)$ is proportional to $$\frac{\partial P(g_k)}{\partial g_k}, P_g(k) = \frac{1}{N_p}\cdot\sum_{n=n_0}^{n_0+N_p-1}|x_k(n)| - \frac{1}{N_p}\cdot\frac{1}{M}\sum_{j=1}^{M}\sum_{n=n_0}^{n_0+N_p-1}|x_j(n)|$$

or $$P_g(k) = \frac{1}{N_p}\cdot\sum_{n=n_0}^{n_0+N_p-1}|x_k(n)| - \frac{1}{N_p}\cdot\sum_{n=n_0}^{n_0+N_p-1}|x_m(n)|, k \neq m$$

The expression of updating the clock phase error correction parameter is:

$$\tau_k^{(i+1)} = \tau_k^{(i)} - \mu_\tau \cdot P_\tau(k) \text{ or } \tau_k^{(i+1)} = \tau_k^{(i)} - \mu_\tau \cdot \text{sign}(P_\tau(k))$$

$P_\tau(k)$ is proportional to $$\frac{\partial P(\tau_k)}{\partial \tau_k},$$

$$P_\tau(k) = \frac{1}{N_p}\cdot\sum_{n=n_0}^{n_0+N_p-1}|x_k(n)-x_{k+1}(n)| - \frac{1}{N_p}\cdot\frac{1}{M}\sum_{n=n_0}^{n_0+N_p-1}\left(\sum_{i=1}^{M-1}|x_i(n)-x_{i+1}(n)|+|x_M(n)-x_1(n+1)|\right), k = 1, 2, 3, \ldots, M-1$$

$$P_\tau(k) = \frac{1}{N_p}\cdot\sum_{n=n_0}^{n_0+N_p-1}|x_k(n)-x_1(n+1)| - \frac{1}{N_p}\cdot\frac{1}{M}\sum_{n=n_0}^{n_0+N_p-1}\left(\sum_{i=1}^{M-1}|x_i(n)-x_{i+1}(n)|+|x_M(n)-x_1(n+1)|\right), k = M$$

sign(.) represents a symbolic operation function, a positive number is 1, a negative number is −1; $\mu_o$, $\mu_g$, $\mu_\tau$ are update step lengths for the bias, gain, and clock phase correction parameters;

In this embodiment, the 1-st to M-th packet correction data are synthesized into the system output data according to the corresponding 1-st to M-th packet master clock phase relation.

Figure 3:
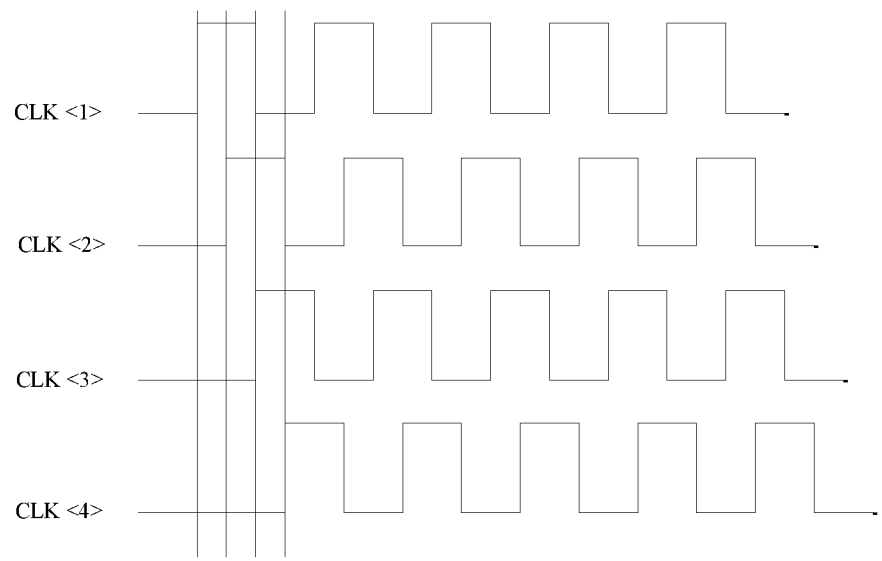
FIG. 3 is a schematic diagram of the packet master clock signal pulse generated by the master clock module of the error compensation correction system of the analog-to-digital converter with a time interleaving structure according to an embodiment of the present disclosure.
Figure 4:
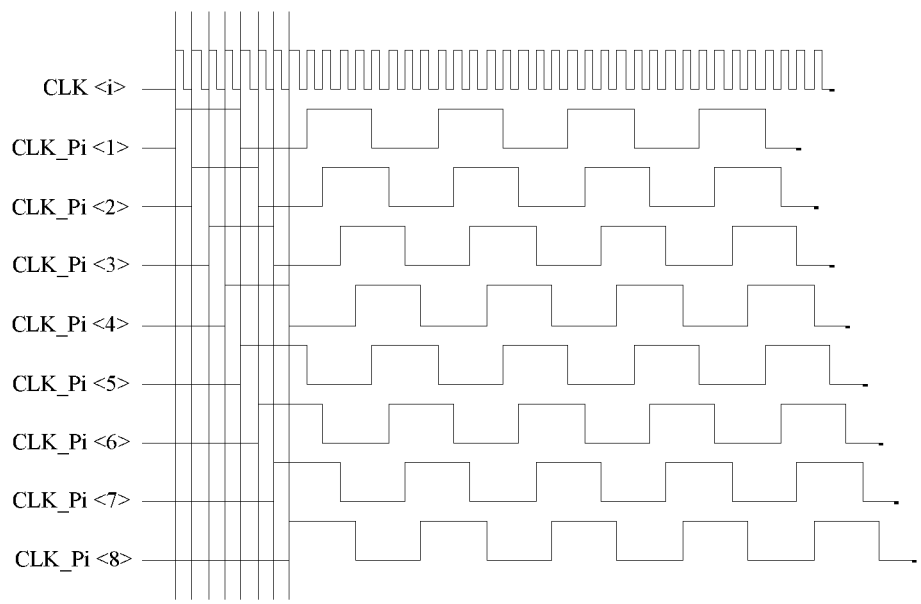
FIG. 4 is a schematic diagram of the packet internal clock pulse generated by the packet internal clock unit of the error compensation correction system of the analog-to-digital converter with a time interleaving structure according to an embodiment of the present disclosure.
Figure 5A:
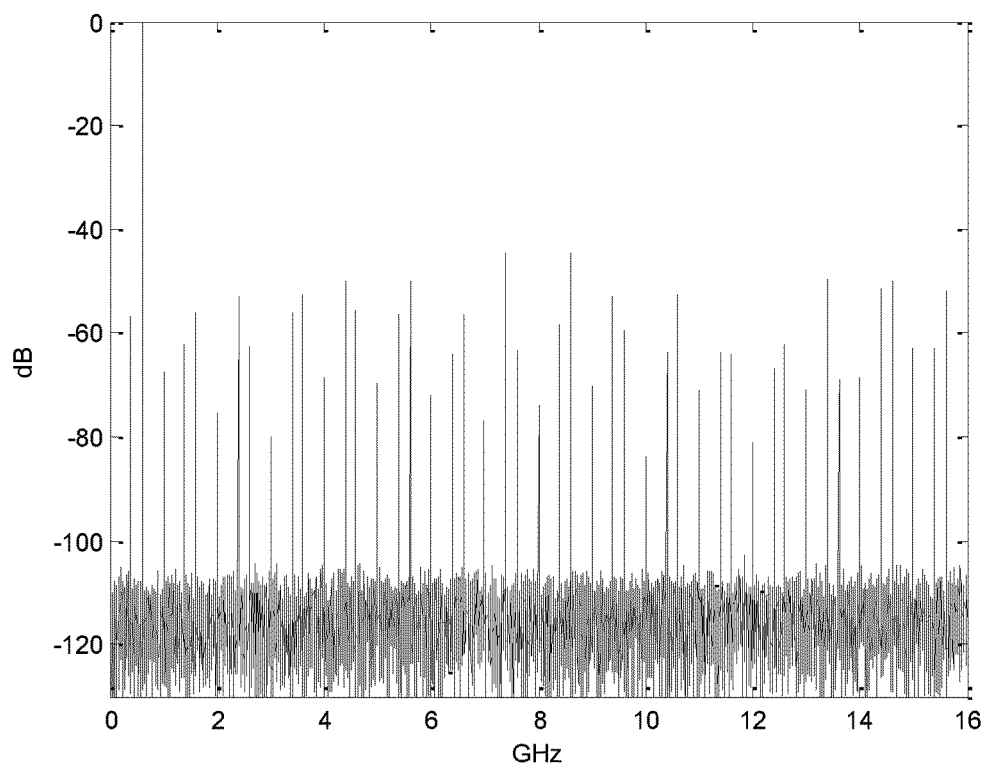
FIG. 5A is a schematic diagram of a dynamic performance simulation of the analog-to-digital converter with a time interleaving structure before being corrected by the error compensation correction system according to an embodiment of the present disclosure.
Figure 5B:
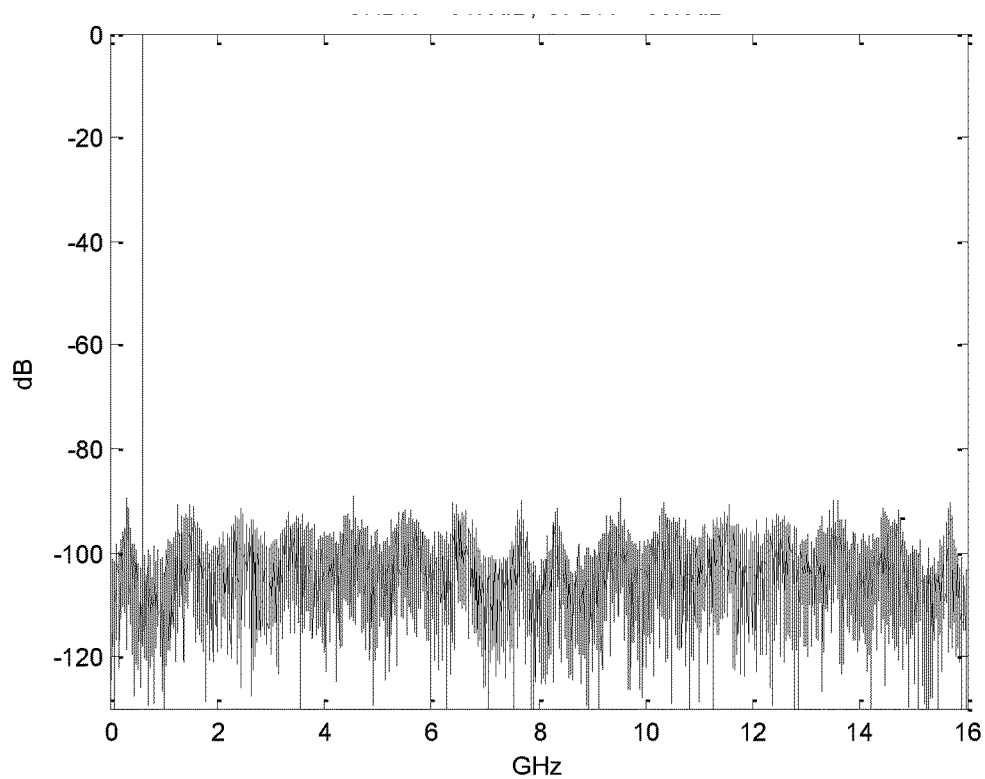
FIG. 5B is a schematic diagram of a dynamic performance simulation of the analog-to-digital converter with a time interleaving structure after being corrected by the error compensation correction system according to an embodiment of the present disclosure.

The following is an embodiment of a practical application for illustration:

Taking a time interleaving ADC with sampling frequency of 12-bit 32 GHz as an example, the system is built with 36 sub-ADCs of the same structure, each sub-ADC has a sampling frequency of 1 GHz and a resolution of 12 bits; the system divides the 36 sub-ADCs into 4 packets (M=4), each packet contains 9 sub-ADCs (N=8, ΔN=1). The master clock module in this embodiment generates four master clocks of 8-GHz with uniform-phase: CLK <1>, CLK <2>, CLK <3>, and CLK <4>. As shown in FIG. 3, a numerical control analog delay line unit is inserted in the path of each master clock. This embodiment includes four packet clock modules of the same structure. The i-th master clock CLK <i> is input to the i-th packet clock module to generate 8 packet internal clocks CLK_Pi<1:8> with uniform phase and frequency of 1 GHz, as shown in FIG. 4. The preset correction value for clock phase error set externally controls the packet numerical control adjustable analog delay line to perform foreground trimming on the phases of the 8 packet internal clocks CLK_Pi<1:8>. The 8 packet internal clocks CLK_Pi<1:8> and 0 level generate, under the control of the random signal generation unit and the clock matrix MUX unit in the packet clock module and according to the above-mentioned operating mode, the operation clocks CLK_Pi<1:9> of the 9 sub-ADCs in the i-th packet. At any time, only 8 sub-ADCs in the i-th packet are connected to the 8 packet internal clocks CLK_Pi<1:8>(i=1, 2, 3, 4), and the input terminal of the operation clock of another sub-ADC is connected to 0 level. This embodiment includes four packet data processing units of the same structure. The i-th packet data processing module conducts an add operation and a multiply operation at the output data of the sub-ADCs in the packet according to the preset correction values for bias error and gain error set externally, to realize the foreground pre-correction of the bias and gain errors between the sub-ADCs in the packet. Under the control of the packet channel clock selection signal output by the i-th packet clock module, the pre-corrected output data of 9 sub-ADCs in the i-th packet is synthesized into the i-th packet output data according to the phase order of the operation clocks of the sub-ADCs. This embodiment includes an error correction module, which, in accordance with the above-mentioned operation mode, eliminates the bias, gain and clock phase errors between packets according to the bias, gain and clock phase correction parameters. The system further includes an adaptive processing module, which, in accordance with the above-mentioned operation mode, estimates the bias, gain, and clock phase error between the packets, and updates the bias, gain, and clock phase correction parameters. The system further includes an overall MUX circuit, to synthesize the sub-ADC outputs of all packets into the system output. Adding non-ideal parameters of interchannel mismatch in the built system, inputting sinusoidal signals, and performing real-time correction as described above. The simulation results are shown in FIG. 5A and FIG. 5B. After the correction, the performance of the time interleaving ADC is significantly improved. The spurious-free dynamic range (SFDR) is improved by 44.4 dB after correction, and the signal to noise distortion ratio (SNDR) is improved by 24 dB after correction.

The above-mentioned embodiments are merely illustrative of the principle and effects of the present disclosure instead of limiting the present disclosure. Modifications or variations of the above-described embodiments may be made by those skilled in the art without departing from the spirit and scope of the disclosure. Therefore, all equivalent modifications or changes made by those who have common knowledge in the art without departing from the spirit and technical concept disclosed by the present disclosure shall be still covered by the claims of the present disclosure.

The invention claimed is:

1. An error compensation correction system for an analog-to-digital converter with a time interleaving structure, comprising an analog-to-digital converter with a time interleaving structure, and further comprising a master clock module, a packet clock module, an error correction module, an adaptive processing module and an overall multiplexer (MUX) circuit;

the analog-to-digital converter with a time interleaving structure includes a plurality of sub-ADCs with a same structure, the sub-ADCs are packeted, a number of the packet clock modules is the same as a packet number of the sub-ADCs, and each packet of sub-ADCs is respectively connected to a corresponding packet clock module;

the master clock module generates a packet master clock; each packet clock module is connected to the master clock module, and an operation clock of the sub-ADC in the packet and a packet channel clock selection signal are obtained through the packet clock module connected with the packet;

the error correction module corrects the analog-to-digital converter according to a correction parameter;

the adaptive processing module estimates bias, gain, and clock phase errors between the packets according to data corrected by the error correction module, and updates the correction parameter;

the overall MUX circuit synthesizes corrected data of each packet into system output data according to a phase order of corresponding packet master clock.

2. The error compensation correction system for an analog-to-digital converter with a time interleaving structure according to claim 1, further comprising a plurality of packet data processing modules with a same structure, each packet processing module is connected to the packet clock module in the same packet, to pre-correct an output data of the sub-ADCs in the packet according to a preset threshold; at the same time, under a control of a packet channel clock selection signal of a corresponding packet, the pre-corrected output data are synthesized into output data of the packet according to a phase order of the operation clocks of the sub-ADC in the packet.

3. The error compensation correction system for an analog-to-digital converter with a time interleaving structure according to claim 1, wherein the packet clock module comprises:

a packet internal clock unit, to generate N packet internal clocks with uniform phase and frequency of fs through the input packet master clock;

a numerical control adjustable analog delay line unit, to adjust a phase of the N packet internal clocks according to a preset threshold;

a random signal generation unit, to generate a packet channel clock selection signal;

a clock matrix MUX unit, to obtain an operation clock of the sub-ADC in the packet according to a packet channel clock selection signal and the packet internal clock.

4. The error compensation correction system for an analog-to-digital converter with a time interleaving structure according to claim 3, wherein the analog-to-digital converter with a time interleaving structure comprises $M \times (N+\Delta N)$ sub-ADCs, M is a number of packets, a sampling frequency of each sub-ADC is fs, and a sampling frequency of the analog-to-digital converter with a time interleaving structure is $M \times N \times fs$;

the clock matrix MUX unit randomly allocates N packet internal clocks and ΔN 0 level signals to the sub-ADCs in the packet as the operation clocks according to the packet channel clock selection signal.

5. An error compensation correction method for an analog-to-digital converter with a time interleaving structure, comprising:
- packeting a plurality of sub-ADCs with a same structure in the analog-to-digital converter with a time interleaving structure;
- connecting each sub-ADC packet with a corresponding packet clock module, a number of packet clock modules is the same as a packet number of the sub-ADCs, and each packet clock module is connected to the master clock module;
- obtaining an operation clock of the sub-ADC in the packet and a packet channel clock selection signal through the packet clock module connected with the packet;
- correcting the analog-to-digital converter according to a correction parameter;
- estimating bias, gain and clock phase errors between the packets according to corrected data, and updating the correction parameter;
- synthesizing corrected data output by each packet into the system output data according to a phase order of corresponding packet master clock, and completing an error compensation correction of the analog-to-digital converter with a time interleaving structure.

6. The error compensation correction method for an analog-to-digital converter with a time interleaving structure according to claim 5, comprising: pre-correcting output data of the sub-ADCs in the packet according to a preset threshold; synthesizing, under a control of the packet channel clock selection signal of a corresponding packet, the pre-corrected output data into output data of the packet according to a phase order of the operation clock of the sub-ADC in the packet; and pre-correcting a phase of the N packet internal clocks according to the preset threshold.

7. The error compensation correction method for an analog-to-digital converter with a time interleaving structure according to claim 5, wherein the analog-to-digital converter with a time interleaving structure comprises M×(N+ΔN) sub-ADCs, M is a number of packets, a sampling frequency of each sub-ADC is fs, and a sampling frequency of the analog-to-digital converter with a time interleaving structure is M×N×fs;
- the N packet internal clocks and ΔN 0 level signals are randomly allocated to the sub-ADCs in the packet as operation clocks according to the packet channel clock selection signal, such that (N+ΔN) sub-ADCs in the packet operate alternately at random.

8. The error compensation correction method for an analog-to-digital converter with a time interleaving structure according to claim 5, wherein the correction parameters comprise a bias correction parameter, a gain correction parameter, and a clock phase correction parameter; a bias error and a gain error between the packets are corrected through the bias correction parameter and the gain correction parameter, packet correction data is output, and a clock phase error is corrected according to the clock phase correction parameter.

9. The error compensation correction method for an analog-to-digital converter with a time interleaving structure according to claim 8, wherein the bias error correction and gain error correction between the packets comprises: conducting an add operation at a k-th bias correction parameter $o_k$ and a k-th packet output data, and then conducting an add operation and a multiply operation at a k-th gain correction parameter $g_k$ and the k-th packet output data, to obtain a k-th packet correction data $x_k(n)$.

10. The error compensation correction method for an analog-to-digital converter with a time interleaving structure according to claim 8, wherein the clock phase error correction comprises:
- decoding a k-th clock phase correction parameter $\tau_k$ to generate a control signal, controlling a numerical control adjustable analog delay line unit inserted in a path of a k-th packet master clock to realize the clock phase error correction of the k-th packet master clock.

11. The error compensation correction method for an analog-to-digital converter with a time interleaving structure according to claim 9, a k-th bias correction parameter $o_k$ is estimated through an optimal value of a bias error loss function, and the bias error loss function is as follows:

$$P\{o_k\} = \arg\min_{o_k}\left\{\left[\frac{1}{N_P}\cdot\sum_{n=n_0}^{n_0+N_P-1} x_k(n)\right]^2\right\}$$

or $$P\{o_k\} = \arg\min_{o_k}\left\{\left[\frac{1}{N_P}\cdot\sum_{n=n_0}^{n_0+N_P-1} x_k(n) - \frac{1}{N_P}\cdot\sum_{n=n_0}^{n_0+N_P-1} x_m(n)\right]^2\right\},$$

make $o_m = 0, k \neq m$ or $$P\{o_k\} = \arg\min_{o_k}\left\{\left[\frac{1}{N_P}\cdot\sum_{n=n_0}^{n_0+N_P-1} x_k(n) - \frac{1}{N_P}\cdot\frac{1}{M}\sum_{i=1}^{M}\sum_{n=n_0}^{n_0+N_P-1} x_i(n)\right]^2\right\}$$

$x_k(n)$ is the k-th packet correction data.

12. The error compensation correction method for an analog-to-digital converter with a time interleaving structure according to claim 9, a k-th gain error parameter $g_k$ is estimated through an optimal value of a gain error loss function, and the gain error loss function is as follows:

$$P\{g_k\} = \arg\min_{g_k}\left\{\left[\frac{1}{N_P}\cdot\sum_{n=n_0}^{n_0+N_P-1} |x_k(n)| - \frac{1}{N_P}\cdot\frac{1}{M}\sum_{j=1}^{M}\sum_{n=n_0}^{n_0+N_P-1} |x_j(n)|\right]^2\right\}$$

or $$P\{g_k\} = \arg\min_{g_k}\left\{\left[\frac{1}{N_P}\cdot\sum_{n=n_0}^{n_0+N_P-1} |x_k(n)| - \frac{1}{N_P}\cdot\sum_{n=n_0}^{n_0+N_P-1} |x_m(n)|\right]^2\right\},$$

make $g_m = 0, k \neq m$ $x_k(n)$ is the k-th packet correction data.

13. The error compensation correction method for an analog-to-digital converter with a time interleaving structure according to claim 9, a k-th clock phase error parameter $\tau_k$ is estimated through an optimal value of a clock phase error loss function, and the clock phase error loss function is as follows:

$$E\{\tau_k\} = \arg\min_{\tau_k}\left\{\left[\frac{1}{N_p} \cdot \sum_{n=n_0}^{n_0+N_p-1} |x_k(n) - x_{k+1}(n)| - \frac{1}{N_p} \cdot \frac{1}{M} \sum_{n=n_0}^{n_0+N_p-1} \left(\sum_{i=1}^{M-1} |x_i(n) - x_{i+1}(n)| + |x_M(n) - x_1(n+1)|\right)\right]^2\right\},$$

$k = 1, 2, 3, \ldots, M-1$ $$E\{\tau_k\} = \arg\min_{\tau_k}\left\{\left[\frac{1}{N_p} \cdot \sum_{n=n_0}^{n_0+N_p-1} |x_k(n) - x_1(n+1)| - \frac{1}{N_p} \cdot \frac{1}{M} \sum_{n=n_0}^{n_0+N_p-1} \left(\sum_{i=1}^{M-1} |x_i(n) - x_{i+1}(n)| + |x_M(n) - x_1(n+1)|\right)\right]^2\right\},$$

$k = M$ $x_k(n)$ is the k-th packet correction data.